(12) United States Patent
Low (10) Patent No.: US 6,846,683 B2
(45) Date of Patent: Jan. 25, 2005

(54) METHOD OF FORMING SURFACE-SMOOTHING LAYER FOR SEMICONDUCTOR DEVICES WITH MAGNETIC MATERIAL LAYERS

(75) Inventor: Kia-Seng Low, Hopewell Junction, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/143,673

(22) Filed: May 10, 2002

(65) Prior Publication Data

US 2003/0211726 A1 Nov. 13, 2003

(51) Int. Cl.[7] .............................................. H01L 21/00
(52) U.S. Cl. ........................................................ 438/3
(58) Field of Search ............................ 438/3, 238, 381, 438/800, 618, 625, 627, 631, 643, 654, 656, 675, 685, 687, 691, 692, 239, 240, 253, 396, 393, 633, 637, 639; 257/E21.665; 365/171

(56) References Cited

U.S. PATENT DOCUMENTS

| | | | |
|---|---|---|---|
| 5,407,698 A | | 4/1995 | Emesh |
| 5,780,323 A | * | 7/1998 | Forouhi et al. .............. 438/131 |
| 5,940,319 A | | 8/1999 | Durlam et al. |
| 6,500,678 B1 | * | 12/2002 | Aggarwal et al. .............. 438/3 |
| 6,528,328 B1 | * | 3/2003 | Aggarwal et al. .............. 438/3 |
| 6,534,809 B2 | * | 3/2003 | Moise et al. .................. 257/295 |
| 6,689,622 B1 | * | 2/2004 | Drewes .......................... 438/3 |
| 2002/0006674 A1 | * | 1/2002 | Ma et al. ......................... 438/3 |
| 2002/0017701 A1 | * | 2/2002 | Klersy et al. ................ 257/536 |
| 2002/0096775 A1 | * | 7/2002 | Ning ............................ 257/763 |
| 2002/0098705 A1 | * | 7/2002 | Low ............................ 438/698 |
| 2002/0160541 A1 | * | 10/2002 | Durcan et al. .................. 438/3 |

FOREIGN PATENT DOCUMENTS

| | | | |
|---|---|---|---|
| EP | 0490608 A2 | 6/1992 | |
| WO | WO 00/31809 | 11/1998 | |
| WO | WO 02/41367 A2 | * 5/2002 | ........... H01L/00/00 |

* cited by examiner

Primary Examiner—George Fourson
Assistant Examiner—Brook Kebede
(74) Attorney, Agent, or Firm—Slater & Matsil, L.L.P.

(57) ABSTRACT

A semiconductor device (118) and method of fabrication thereof, wherein a plurality of conductive lines (124) are formed over a workpiece, a surface-smoothing conductive material (140) is disposed over the conductive lines (124), and a magnetic material (132) disposed is over the surface-smoothing conductive material (140). The surface-smoothing conductive material (140) has a smaller grain structure than the underlying conductive lines (124). The surface-smoothing conductive material (140) is polished so that the surface-smoothing conductive material (140) has a texturally smoother surface than the surface of the conductive lines (124).

8 Claims, 5 Drawing Sheets

METHOD OF FORMING SURFACE-SMOOTHING LAYER FOR SEMICONDUCTOR DEVICES WITH MAGNETIC MATERIAL LAYERS

CROSS-REFERENCE TO RELATED APPLICATIONS

The present invention is related to U.S. patent application Ser. No. 10/053,019, filed on Jan. 18, 2002 by Low, entitled "Single Step Chemical Mechanical Polish Process to Improve the Surface Roughness in MRAM Technology", which is incorporated herein by reference.

TECHNICAL FIELD

This invention relates to semiconductor devices, and more particularly to semiconductor devices with magnetic material layers.

BACKGROUND OF THE INVENTION

Semiconductors are used in integrated circuits for electronic applications, including radios, televisions, cell phones, and personal computing devices, as examples. One type of semiconductor device is a semiconductor storage device, such as a dynamic random access memory (DRAM) and flash memory, which use a charge to store information. In some semiconductor devices, magnetic materials are used, such as in Magnetic Random Access Memory (MRAM) devices. MRAM devices are increasing in popularity as storage devices because of their advantages of non-volatility, three dimensional cell packing capability, lower power consumption, and simpler and less expensive processing compared to conventional DRAM and nonvolatile flash memories, as examples. MRAM devices use the relative orientation of the magnetization in ferromagnetic materials to store information.

Figure 1A:
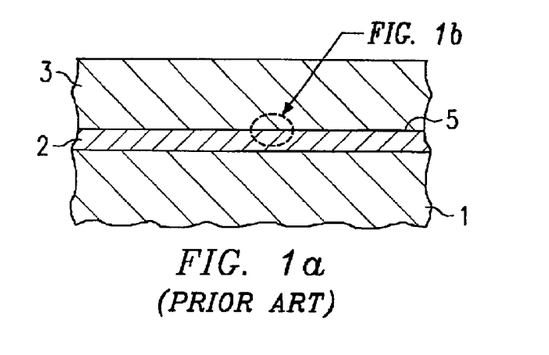
FIGS. 1a and 1b show the effect of Neel coupling that occurs due to roughness at the interfacial surface of a magnetic material layer with an underlying layer.
Figure 1B:
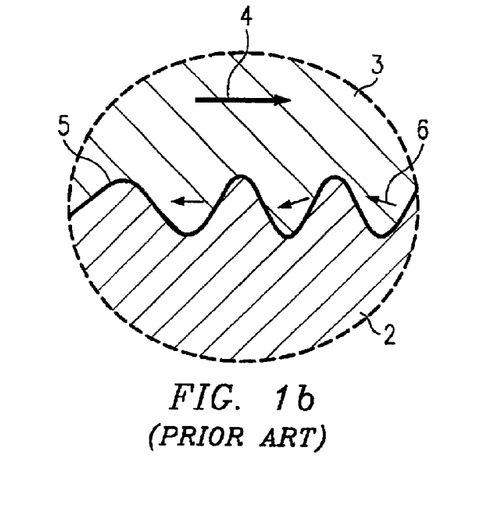

Magnetic material layers may be negatively affected by surface irregularities of underlying layers, which can be problematic in semiconductor processing. For example, the relative orientation and switching of magnetization may be corrupted by interfacial roughness, known as "Neel coupling". Neel coupling is the reminiscent magnetism due to the roughness of the interfacial surface, as shown in FIGS. 1a and 1b. FIG. 1a illustrates a cross-sectional view of a semiconductor device having a first magnetic material layer 1, a non-magnetic material layer 2 disposed over the first magnetic material layer 1, and a second magnetic material layer 3 disposed over the non-magnetic material layer 2. FIG. 1b illustrates a more detailed view of the junction of the second magnetic material layer 3 with the underlying non-magnetic material layer 2. The arrow 4 represents the dominant magnetism direction of second magnetic material layer 3. The interface 5 of layers 3 and 2 is rough, as shown. Arrows 6 represent the reminiscent magnetism direction of underlying first magnetic material layer 1 (not shown in FIG. 1b).

Neel coupling becomes severe when an uneven or rough topography is propagated from the prior underlying material layers. This may be caused by a material such as copper that has a large, rough grain structure. Neel coupling deleteriously affects MRAM device performance and reliability.

Chemical-mechanical polishing (CMP) is a process that is frequently used to polish surfaces of semiconductor devices, for example, between material deposition steps. CMP is often used in damascene processes, in which holes and trenches are formed within a dielectric, and then filled with a conductor. Copper conductive lines are usually formed using a damascene process, because copper is difficult to etch. A subsequent CMP step removes excess copper from the top surface of the dielectric.

Figure 1C:
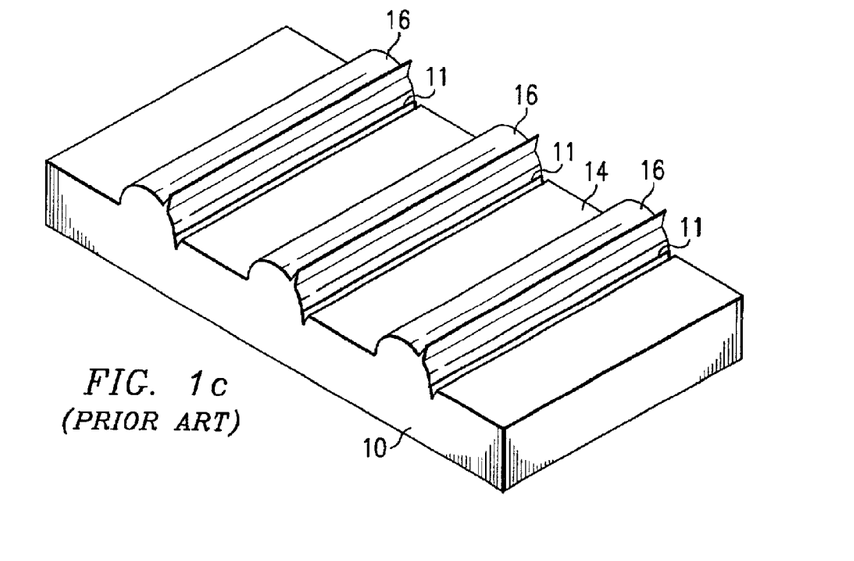
FIG. 1c shows a perspective view of additional edge topography which can adversely affect MRAM performance.

When a conventional CMP process is used, the edges of patterned features tend to have additional edge topography 11 as shown on the substrate 10 in FIG. 1c. Various features may be formed on the surface of substrate 10. These features may include protrusions 16 that extend above the surface 14 of the substrate 10. In other embodiments, the features may include trenches that extend below the surface of the substrate that may be subsequently filled with material, such as a conductive material.

Undesired edge topography 11 can result from the CMP step for forming features 16 which may comprise conductive lines (or of the materials that fill a trench, not shown). This edge topography 11 may adversely impact device performance, particularly with magnetic random access memory (MRAM) devices. The defects 11 in the edge topography create a surface irregularity, and may distort or cause pinning effects on the magnetic field of the domains of overlying ferromagnetic materials. Distortion and pinning results in undesirable magnetostatic fields. Also, additional edge topography 11 may introduce shorts through the thin magnetic tunneling junction when the magnetic stack is deposited over the edge topography.

SUMMARY OF THE INVENTION

Embodiments of the present invention achieve technical advantages as a method and structure for providing a smooth conductive surface before depositing magnetic material layers. A surface-smoothing conductive material comprising a small grain structure and having a texturally smooth top surface is deposited over conductive lines. The surface-smoothing conductive material is polished using CMP to provide a smooth surface over which magnetic material may then be deposited.

In one embodiment, a method of fabricating a semiconductor device is disclosed. The method includes providing a workpiece, forming conductive lines over the workpiece, and depositing a surface-smoothing conductive material over the conductive lines. The surface-smoothing conductive material is polished, and a magnetic material layer is deposited over the polished surface-smoothing conductive material.

In another embodiment, a semiconductor device is disclosed, having a workpiece, a plurality of conductive lines formed over the workpiece, a surface-smoothing conductive material disposed over the conductive lines, and a magnetic material disposed over the surface-smoothing conductive material.

Further disclosed is an MRAM device, including a plurality of first conductive lines, a plurality of magnetic memory cells disposed over the first conductive lines, and a plurality of second conductive lines disposed over the magnetic memory cells. Each magnetic memory cell is located at an intersection of a first and second conductive line, and a surface-smoothing conductive material is disposed between the first conductive lines and each magnetic memory cell.

Advantages of embodiments of the invention include reducing or eliminating Neel coupling effects, and improving MRAM device reliability and performance. Surface topography is minimized, and undesirable effects due to misalignment of the magnetic stack to underlying levels can be avoided. Scalability of MRAM devices may be improved with the use of embodiments of the present invention.

BRIEF DESCRIPTION OF THE DRAWINGS

The above features of the present invention will be more clearly understood from consideration of the following descriptions in connection with accompanying drawings in which.

Corresponding numerals and symbols in the different figures refer to corresponding parts unless otherwise indicated. The figures are drawn to clearly illustrate the relevant aspects of the preferred embodiments and are not necessarily drawn to scale.

DETAILED DESCRIPTION OF PREFERRED EMBODIMENTS

Prior art damascene processes will be described, followed by a discussion of preferred embodiments of the present invention and some advantages thereof.

FIGS. 2a–2e illustrate a prior art method of forming a magnetic memory device 18 using a damascene process. A dielectric layer 20 includes a trench 22 in which a metallic material 24 has been deposited on top of a liner 26. The liner 26 also extends across the top surface 28 of the dielectric layer 20. The liner 26 prevents the metallic material 24 from diffusing into the dielectric layer 20 and/or silicon. The metallic material 24 may comprise a conductive material such as aluminum or copper.

Figure 2A:
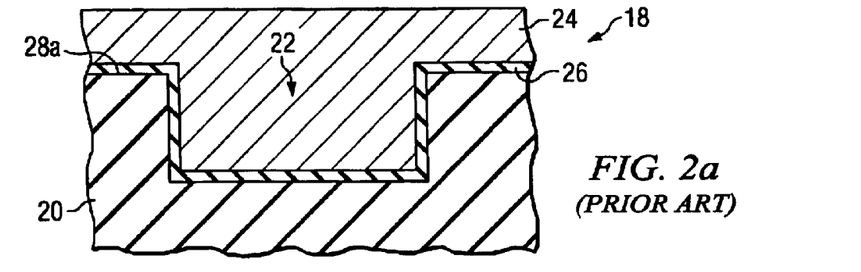
FIGS. 2a–2e show cross-sectional views of a prior art method of forming a magnetic memory device.
Figure 2B:
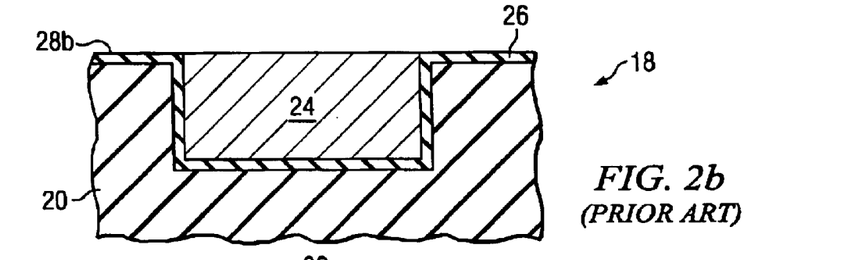
Figure 2C:
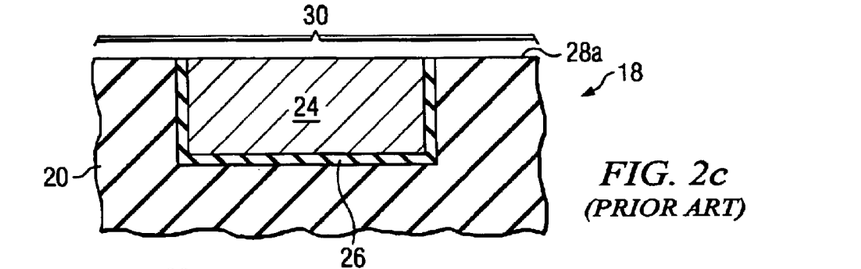

FIG. 2b shows the device 18 after a first polish step of a conventional CMP has been performed on the wafer. The conventional CMP process is a two-step process in which a first polish step includes removing the excess metallic material 24 from the surface of the liner 26. The first polish step removes the bulk of the metallic material 24 that resides on the top surface 28 but stops short of removing the liner 26. A second CMP step removes the liner 26 on the top surface 28 resulting in a relatively planar surface 30, as shown in FIG. 2c. The second polish step typically comprises using a different polishing slurry than that used for the first polish step, because of the differing polish rates of the liner 26 and metallic material 24. In some applications, different polishing pads may be used, as well.

Depending on the metallic material 24 used, the CMP steps may leave the metallic material 24 with a rough top surface texture. For example, if copper is used for metallic material 22, copper has a rough grain structure and leaves a rough top surface texture even after CMP (refer to FIG. 1b).

Figure 2D:
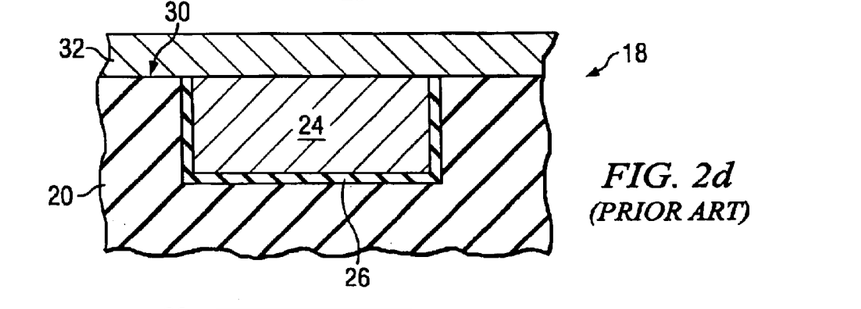

After the conventional CMP process is completed, a magnetic stack layer 32 is deposited over the planar surface 30, as illustrated in FIG. 2d. The stack layer 32 typically comprises a plurality of layers of one or more of nickel, iron, cobalt, platinum, manganese, metallic oxides, or other suitable magnetic material or compounds. The stack layer 32 typically includes a thin insulating layer to form tunnel junctions, such as $AlO_2$, for example. The magnetic stack layer is then patterned and etched to form the device 18 shown in FIG. 2e, with the magnetic stack 32 comprising a magnetic memory cell of the MRAM device. Dielectric layers and conductive lines are disposed over the magnetic stack 32 in subsequent processing steps, not shown.

Figure 2E:
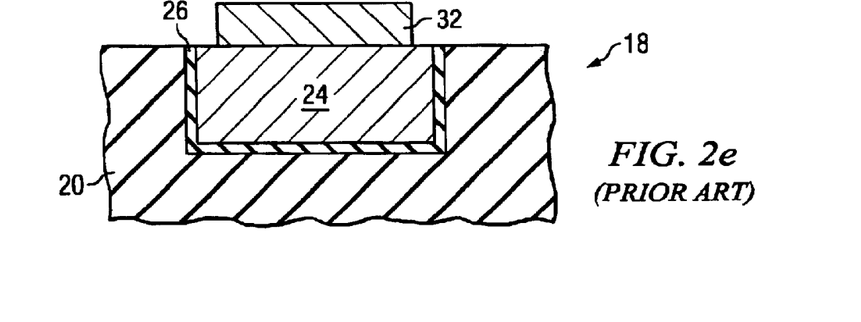
Figure 3A:
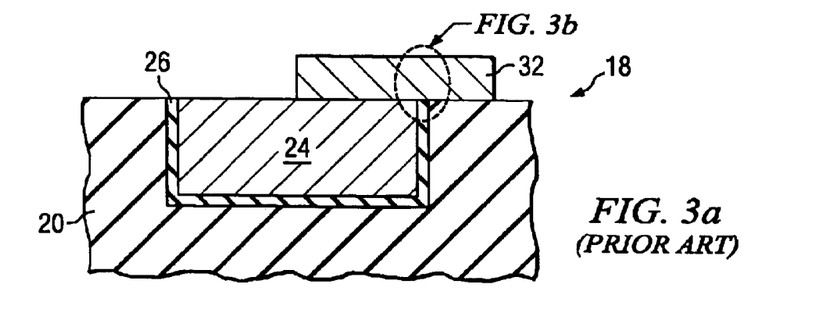
FIGS. 3a–3b illustrate problems with misalignment and CMP processes of the prior art.

When the device 18 has ideal alignment between the stack layer 32 and the metallic material 24, as shown in FIG. 2e, the conventional CMP process provides sufficient planarization within an acceptable tolerance. However, real world processes may frequently result in some mis-alignment, as shown in FIG. 3a. Furthermore, some metallic materials such as copper have a course grain structure and have a rough texture, even after polishing.

Figure 3B:
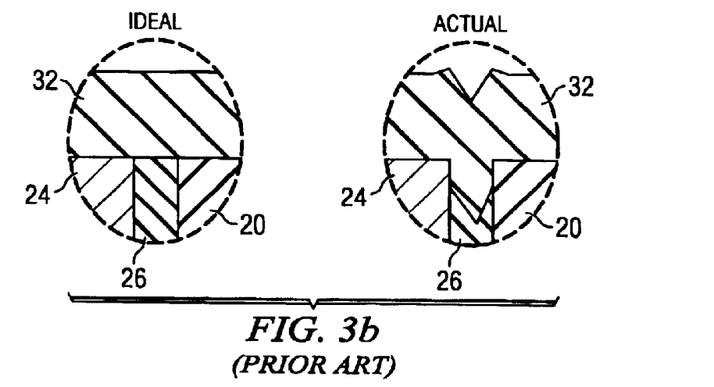

FIG. 3b shows a close-up view of the magnetic stack misalignment portion of FIG. 3a. In an ideal CMP process, the misaligned portion would appear as shown in the "ideal" diagram in the left side of FIG. 3b. However, in actual practice, the two CMP polish steps can result in the liner 26 being severely eroded beneath the dielectric layer 20 surface, resulting in dishing of the liner 26. The resulting topography for a real world process is illustrated in the right side ("actual") of FIG. 3b. When the magnetic stack material 32 is formed over the uneven metallic material 24 and dished liner 26, the device experiences Neel coupling, and the top surface of the magnetic stack 32 takes on a similar topography to the underlying topography.

What is needed in the art is a method and structure for smoothing the top surface of metal layers prior to the deposition of subsequent magnetic metal stack layers, to prevent Neel coupling.

Figure 4A:
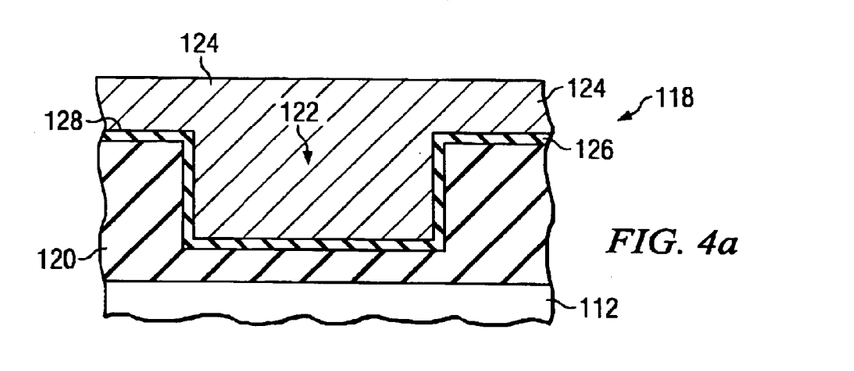
FIGS. 4a–4e illustrate a processing method and structure in accordance with an embodiment of the present invention, wherein a surface-smoothing conductive material is deposited over conductive lines prior to magnetic stack material deposition.

FIGS. 4a–4d illustrate cross-sectional views of a semiconductor device at various stages of fabrication in accordance with a preferred embodiment of the present invention. FIG. 4a shows a semiconductor device 118 wherein a plurality of trenches 122 (although only one is shown in the figure) formed in a dielectric layer 120. A liner 126 is deposited over the dielectric layer 120. The liner 126 may comprise Ta, TaN, Ti, TiN, or WN, as examples. The liner 126 may comprise about 300 Angstroms to 600 Angstroms of material, and more preferably comprises about 500 Angstroms of material. The dielectric layer 120 may comprise an insulator such as silicon dioxide or a low dielectric constant (low-k) material such as SILK™, as examples.

The dielectric layer 120 may be formed or deposited over a workpiece 112. The workpiece 112 may include a semiconductor substrate comprising silicon or other semiconductor materials covered by an insulating layer, for example. The workpiece 112 may also include other active components or circuits formed in the front end of line (FEOL), not shown. The workpiece 112 may comprise silicon oxide over single-crystal silicon, for example. The workpiece 112 may include other conductive layers or other semiconductor elements, e.g. transistors, diodes, etc. Compound semiconductors, GaAs, InP, Si/Ge, or SiC, as examples, may be used in place of silicon.

Figure 5:
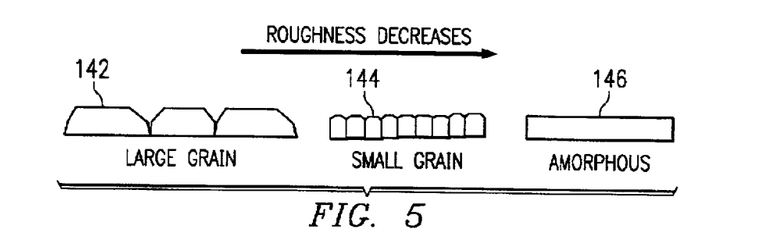
FIG. 5 illustrates a cross-sectional view of the topography of materials having various grain structures.

A conductive material 124 preferably comprising a metallic material, such as copper, is deposited over the dielectric layer 120 and liner 126, as shown in FIG. 4a. The conductive material 124 preferably comprises a highly conductive material having a low resistance. The conductive material 124 may comprise a large grain structure 142 having a top surface with a rough texture, as shown in FIG. 5, for example.

Figure 4B:
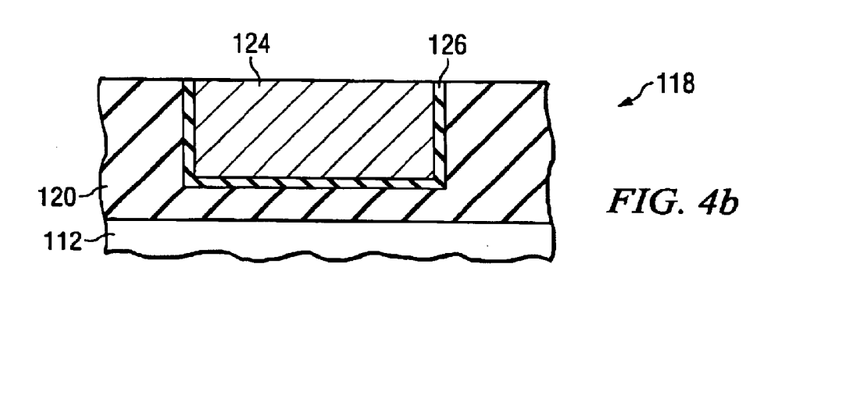

The wafer is polished, for example, using a two-step CMP, to remove excess conductive material and liner 126 from the top surface 128 of the dielectric layer 120 and form conductive lines 124, as shown in FIG. 4b. The CMP slurry typically comprises abrasive particles, an oxidizer, a corrosion inhibitor, and additives, as examples. The oxidizer may comprise hydrogen peroxide, hydroxylamine, potassium iodate, or a combination thereof, as examples.

Figure 4C:
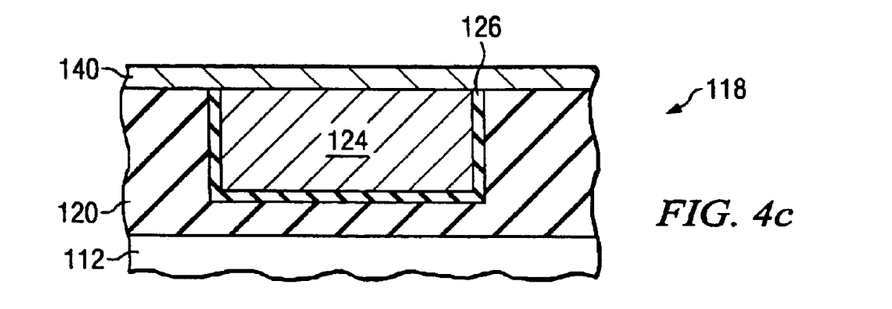

A surface-smoothing conductive material 140 is deposited over the wafer, as shown in FIG. 4c. The surface-smoothing conductive material 140 encapsulates the conductive lines 124 and isolates subsequently deposited layers from the surface roughness of underlying material levels, such as conductive lines 124. The surface-smoothing conductive material 140 preferably comprises a material having a smaller grain structure 144 or 146 (see FIG. 5) than the grain structure 142 of the conductive lines 124. The surface-smoothing conductive material 140 preferably comprises a material having a smoother top surface texture than the top surface texture of the conductive lines 124.

The surface-smoothing conductive material 140 preferably comprises about 400 Angstroms of a conductive material, such as TaN, Ta, TiN or a copper alloy, as examples, although other conductive materials having a smaller grain structure and texturally smoother top surface than conductive lines 124 may be used.

Figure 4D:
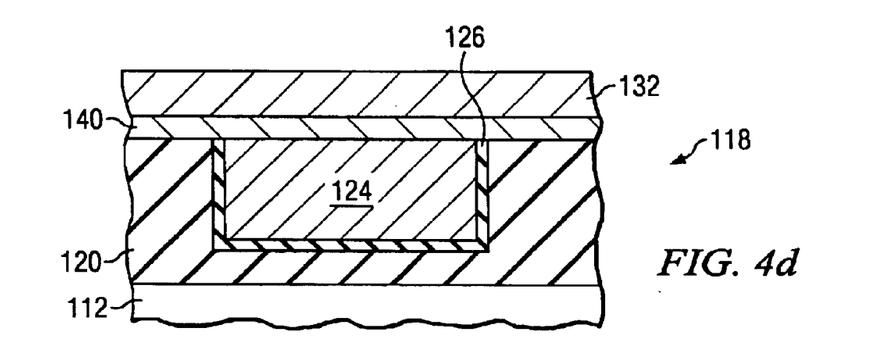

The surface-smoothing conductive material 140 is polished, for example, using a CMP process, to remove about 100 to 300 Angstroms of the surface-smoothing conductive material 140 from the wafer surface, as shown in FIG. 4d. About 100 to 300 Angstroms of the surface-smoothing conductive material 140 are left remaining over the dielectric 120 and conductive lines 124. The amount of surface-smoothing conductive material 140 removed depends on the roughness of the underlying topography of the conductive lines 124, liner 126 and dielectric layer 120, for example.

Figure 4E:
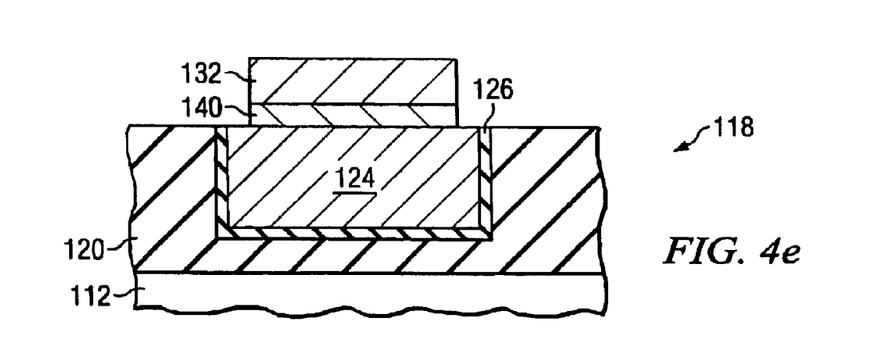

A magnetic stack layer 132 is then deposited on top of the surface-smoothing conductive material 140, as shown in FIG. 4d. The magnetic stack layer 132 is patterned, and portions of the magnetic stack layer 132 are removed to leave magnetic memory cells 132 formed over the conductive lines 124, with a layer of surface-smoothing conductive material 140 residing between the magnetic memory cells 132 and the conductive lines 124, as shown in FIG. 4e.

The patterning of the stack layer 132 and surface-smoothing conductive material 140 may utilize a photoresist layer (not shown) that is patterned using conventional photolithography. The masking process results in the stack layer 132 having exposed and non-exposed portions. The masking process is followed by an etch process, e.g., preferably a plasma etch of the stack layer 132 to remove the exposed portions of the stack layer 132, resulting in the pattern as shown in FIG. 4e.

During the etch process of the magnetic stack layer 132, preferably, in accordance with an embodiment of the present invention, the surface-smoothing conductive material 140 over the top surface of the dielectric 120 is also simultaneously removed during the magnetic stack etch.

Figure 4F:
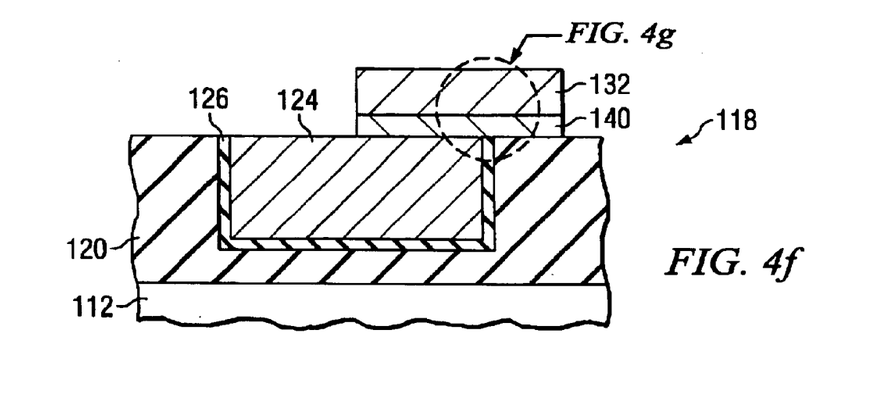
FIGS. 4f–4g show the smoothing effects of the surface-smoothing conductive material of the present invention over rough topography.
Figure 4G:
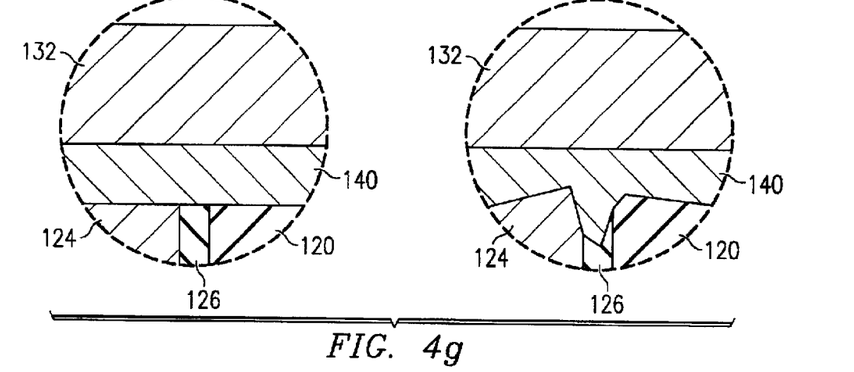

The use of a surface-smoothing conductive material 140 over the conductive lines 124 ensures that the magnetic memory cells 132 are formed over a texturally smooth surface. Even if the magnetic stack 132 and surface-smoothing conductive material 140 results in some mis-alignment over the conductive lines 124, as shown in FIG. 4f, any surface irregularities such as dishing of the liner 126, (see the "actual" portion of FIG. 4g), the surface-smoothing conductive material 140 provides a smooth surface at the interface of the magnetic stack layer 132.

As stated previously, preferably the surface-smoothing conductive material 140 comprises a material having a smaller grain structure than the material used for conductive lines 124. FIG. 5 illustrates cross-sectional views of the grain structure of various materials. Copper has a large grain structure 142, while the material used for the surface-smoothing conductive material 140 in accordance with embodiments of the present invention preferably have small grain structures 144 or amorphous grain structures 146. Textural roughness and grain structure are a function of the material properties of the materials selected.

Figure 6A:
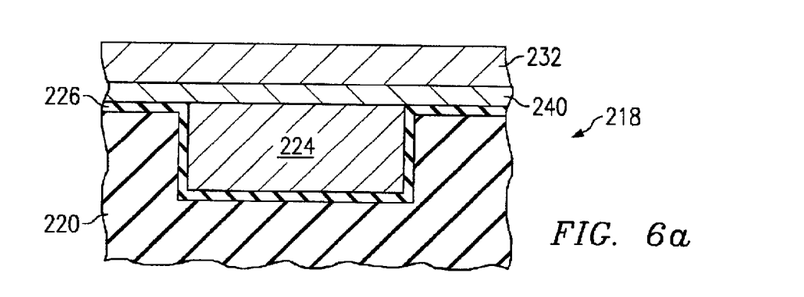
FIGS. 6a–6b illustrate cross-sectional views of another embodiment of the present invention.

In an alternative embodiment of the present invention, the liner 226 may be left remaining on the top surface of the wafer while the magnetic stack material 232 is patterned, as shown in FIG. 6a, and described in U.S. patent application Ser. No. 10/053,019, filed on Jan. 18, 2002 by Low, entitled "Single Step Chemical Mechanical Polish Process to Improve the Surface Roughness in MRAM Technology", which is incorporated herein by reference.

Figure 6B:
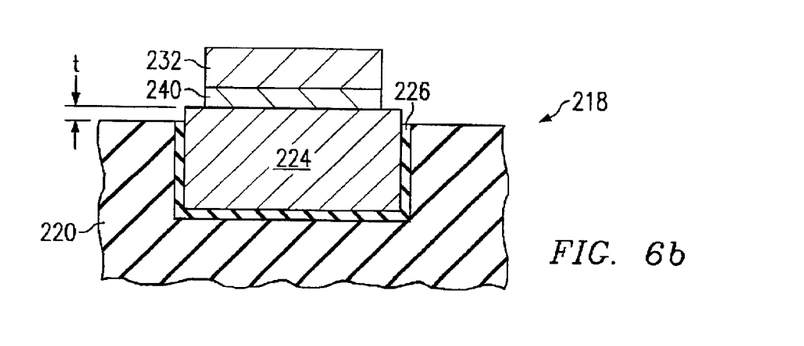

In this embodiment, a single CMP process is used to remove the excess conductive material 224 from the top surface of the wafer, leaving the liner 226 remaining over the top surface of the dielectric layer 220. The surface-smoothing conductive material 240 is deposited over the liner 226 and conductive lines 224, and the surface-smoothing conductive material 240 is polished, as described with reference to FIGS. 4c and 4d. The magnetic stack material layer 232 is deposited over the surface-smoothing conductive material 240 and the magnetic stack material layer 232 is patterned and etched to form magnetic memory cells 232, as shown in FIG. 6b.

At the time of magnetic stack material 232 etch, not only are the exposed portions of the stack layer 232 and surface-smoothing conductive material 240 removed, but the liner 226 that remains on the dielectric 230 top surface is also preferably simultaneously removed during the magnetic stack 232 and surface-smoothing conductive material 240 etch.

Simultaneous removal of the exposed portion of the liner 226 with the magnetic stack 232 and surface-smoothing conductive material 240 etch eliminates the need for a second step in the CMP process, a separate step that is required in the prior art to form conductive lines 224. The elimination of the second CMP step advantageously decreases the chances of dishing and eroding of the liner 226 which is particularly problematic when mis-alignment of the stack layer 232 occurs. FIG. 6b illustrates the resulting device in which the conductive line metallic material 224 extends a distance "t" above the dielectric 220 top surface. This distance "t" is substantially equal to the thickness of the liner 226.

The use of a surface-smoothing conductive material 140/240 over conductive lines 124/224 is advantageous in that the magnetic stack material 132/232 is deposited over the smoother textural top surface of the surface-smoothing conductive material 140/240 rather than the texturally rough top surface of the conductive lines 124/224, which reduces or eliminates Neel coupling. The surface-smoothing conductive material 140/240 encapsulates the underlying conductive lines 124/224, edge topography, dipping and uneven topography that can occur in underlying layers 140/240/126/226/120/220.

Other advantages of the invention include minimizing surface topography and undesirable effects due to misalignment of the magnetic stack to underlying levels can be avoided, which increases the scalability of the MRAM device.

Furthermore, the surface-smoothing conductive material 140/240 may act as an etch stop before exposing the underlying metal 124/224 during the magnetic stack 132/232 etch. This is advantageous because sputtering of the metal, e.g., copper, in the underlying metal level 124/224 during the magnetic stack 132/232 etch is reduced.

While the invention has been described with reference to illustrative embodiments, this description is not intended to be construed in a limiting sense. Various modifications in combinations of the illustrative embodiments, as well as other embodiments of the invention, will be apparent to persons skilled in the art upon reference to the description. In addition, the order of process steps may be rearranged by one of ordinary skill in the art, yet still be within the scope of the present invention. It is therefore intended that the appended claims encompass any such modifications or embodiments. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A method of fabricating a semiconductor device, comprising:

providing a workpiece;

forming conductive lines over the workpiece, wherein forming the conductive lines comprises forming a dielectric layer over the workpiece, etching a plurality of trenches in the dielectric layer, depositing a liner on the top surface of the dielectric layer and within the trenches, depositing a metal layer over the liner, and polishing the metal layer until the metal layer is coplanar with the liner on the top surface of the dielectric layer, leaving a portion of the liner exposed;

depositing a surface-smoothing conductive material over the conductive lines;

polishing the surface-smoothing conductive material;

depositing a magnetic material layer over the polished surface-smoothing conductive material; and patterning the magnetic material layer, wherein portion of the magnetic material layer are removed simultaneously with portions of the liner to form magnetic stacks.

2. The method according to claim 1, wherein the conductive lines comprise a top surface, further comprising removing portions of the surface-smoothing conductive material from at least the conductive line top surface where magnetic material does not reside.

3. The method according to claim 1, wherein depositing a surface-smoothing conductive material comprises depositing a conductive material having a top surface that is texturally smoother than the conductive line top surface.

4. The method according to claim 1, wherein depositing a surface-smoothing conductive material comprises depositing a conductive material having a smaller grain structure than the grain structure of the conductive lines.

5. The method according to claim 1, wherein depositing a surface-smoothing conductive material comprises depositing about 400 Angstroms of TaN, Ta, TiN or a copper alloy.

6. The method according to claim 5, wherein polishing the surface-smoothing conductive material comprises a chemical-mechanical polishing process, wherein polishing the surface-smoothing conductive material comprises removing about 100–300 Angstroms of the surface-smoothing conductive material.

7. The method according to claim 1, wherein the method comprises fabricating a magnetic random access memory (MRAM) device.

8. The method according to claim 1, wherein the surface-smoothing conductive material is adapted to reduce Neel coupling between the conductive lines and the magnetic material layer.

* * * * *

UNITED STATES PATENT AND TRADEMARK OFFICE
CERTIFICATE OF CORRECTION

PATENT NO. : 6,846,683 B2
DATED : January 25, 2005
INVENTOR(S) : Low

It is certified that error appears in the above-identified patent and that said Letters Patent is hereby corrected as shown below:

Column 3,
Line 45, delete "28" and insert -- 28a --.
Line 57, delete "28" and insert -- 28b of the liner 26 --.
Line 58, delete "on" and insert -- from --.
Line 59, delete "28" and insert -- 28a of the dielectric layer 20 --.

Column 4,
Line 1, delete "22" and insert -- 24 --.

Column 5,
Line 14, insert a space between "A" and "surface".

Column 6,
Line 44, delete "230" and insert -- 220 --.

Column 8,
Line 10, delete "portion" and insert -- portions --.

Signed and Sealed this

Tenth Day of May, 2005

JON W. DUDAS
*Director of the United States Patent and Trademark Office*